US006819567B2

(12) United States Patent
Baker et al.

(10) Patent No.: US 6,819,567 B2
(45) Date of Patent: Nov. 16, 2004

(54) APPARATUS AND SYSTEM FOR FUNCTIONAL EXPANSION OF A BLADE

(75) Inventors: Bruce E. Baker, Round Rock, TX (US); Martin Joseph Crippen, Apex, NC (US); Robert Mark Lindsay, Raleigh, NC (US); Michael Sven Miller, Raleigh, NC (US); Peter Andrew Smith, Cary, NC (US); Brian Alan Trumbo, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 121 days.

(21) Appl. No.: 10/306,373

(22) Filed: Nov. 27, 2002

(65) Prior Publication Data

US 2004/0100775 A1 May 27, 2004

(51) Int. Cl.[7] .................................................. G06F 1/20
(52) U.S. Cl. ................... 361/724; 312/223.2; 165/80.4; 439/928.1
(58) Field of Search .................................. 361/679–687, 361/724–727; 312/223.1–223.6; 174/15.2; 165/80.4, 104.26; 439/928.1, 170

(56) References Cited

U.S. PATENT DOCUMENTS

| 5,995,363 | A  | * | 11/1999 | Wu ............................. 361/679 |
| 6,560,099 | B1 | * | 5/2003  | Chang ........................ 361/685 |
| 6,567,271 | B2 | * | 5/2003  | Stone et al. ................. 361/724 |
| 6,724,625 | B2 | * | 4/2004  | Inoue ......................... 361/700 |

* cited by examiner

Primary Examiner—Hung Van Duong
(74) Attorney, Agent, or Firm—Scott W. Reid (57) ABSTRACT

The functionality of a blade is expanded by the installation of an expansion unit including expansion components. The blade and expansion unit are provided with connectors allowing the blade components to access and utilize the expansion components when the connectors are mated. The blade and expansion unit include elements ensuring that the connectors align properly as the expansion unit is installed onto the blade, making the installation simple and quick. The blade and expansion unit also include elements securing the connection between the two, once made.

10 Claims, 6 Drawing Sheets

APPARATUS AND SYSTEM FOR FUNCTIONAL EXPANSION OF A BLADE

BACKGROUND OF THE INVENTION

1. Field of the Invention

The present invention relates to the area of computer servers and server blades and more specifically to a system of blades for use in a blade system comprising a chassis and a number of blades adapted to be interconnected with the chassis. Even more specifically, the present invention relates to an optionally-attachable expansion unit which may be used to expand the function and capability of a given blade.

2. Description of the Problem Solved by the Present Invention

Blades provide many varied types of functions and services when used within a blade system. A blade system such as the one disclosed in more detail below provides the capability to add or remove blades from the system while the blade system is in operation. This addition or deletion of components while the system is operating is known as "hot plugging" the components. This flexibility and expandability is one of the cornerstones of the popularity of such systems.

There are times when it would be desirable to users of such a blade system to be able to expand the capabilities of a blade without having to add an entire new blade. Each blade requires its own connection into the blade system, the provision of power, etc., all of which create demands on the infrastructure of the blade system. By expanding the functionality of an already-present blade, these additional demands on the blade system itself are avoided or minimized.

A blade expansion meeting such a need should be easy to install and should fit seamlessly within the existing blade system, including the chassis. The connection between the blade and such an expansion unit should be secure and foolproof.

These unresolved problems and deficiencies are solved by the present invention in the manner described below.

SUMMARY OF THE INVENTION

The above-mentioned needs have been met in accordance with the present invention by providing for an apparatus and system that satisfies these needs. Accordingly, it is an object of the present invention to solve an expandability problem in a blade for use in a blade system. The present invention contemplates an expansion unit carrying expansion components which provide a blade with additional functionality. These expansion components may include additional storage such as one or more hard drives, additional processing or communications capabilities, or any other functionality desirable to a blade, all of which are easily identifiable by those skilled in the relevant arts.

The expansion unit of the present invention includes a connector designed to mate securely with a connector provided on the blade. When mated, communication across these connectors between the blade and the expansion unit allow the expansion components to provide expanded functionality to the blade. The expansion unit of the present invention is also provided with a means for providing a releasable pivoting connection between one end of the expansion unit and one end of the blade. Once this connection is made, the expansion unit and the blade may be rotated toward one another about this connection until the connectors are securely mated. In this manner, the connection of the expansion unit to the blade is made simple and secure. The expansion unit also includes at least one guide member which meets with at least one guide member of the blade to aid in aligning the connectors. Preferably, the expansion unit is provided with at least two guide members, one ensuring proper side-to-side alignment and one ensuring proper front-to-back alignment.

The expansion unit of the present invention is also preferably supplied with means to secure the physical connection between the expansion unit and the blade, once the connectors are mated. This securing means will preferably be releasable so that the expansion unit may easily be un-installed by the user.

BRIEF DESCRIPTION OF THE DRAWINGS

Some of the purposes of the invention having been stated, others will appear as the description proceeds, when taken in conjunction with the accompanying drawing, in which.

DETAILED DESCRIPTION OF THE PRESENT INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

Server Blade System Overview

Figure 1:
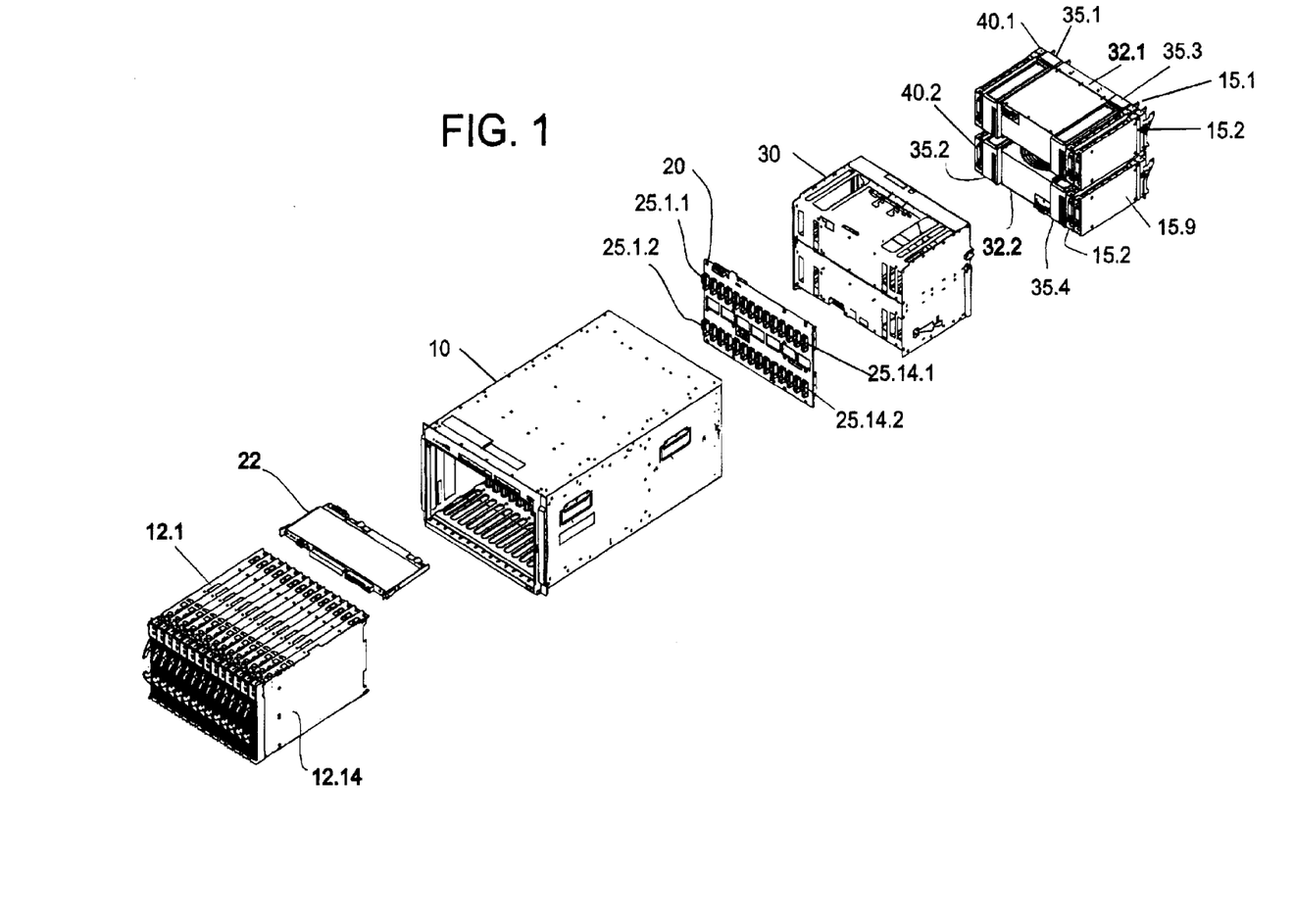
FIG. 1 is a front, top and right side exploded perspective view of a server blade system of the present invention.

FIG. 1 is a front, top and right side exploded perspective view of a server blade system. Referring to this figure, main chassis 10 houses all the components of the server blade system. Up to 14 processor blades 12.1 through 12.14 (or other blades, such as storage blades) are hot-plugable into the 14 slots in the front of chassis 10. The term "server blade", "processor blade", or simply "blade" is used throughout the specification and claims, but it should be understood that these terms are not limited to blades that only perform "processor" or "server" functions, but also include blades that perform other functions, such as storage blades, which typically include hard disk drives and whose primary function is data storage. Other types of blades to which the present invention is applicable, whether now in use or later developed, will be easily identified by those of reasonable skill in the art.

Processor blades provide the processor, memory, hard disk storage and firmware of an industry standard server. In addition, they include keyboard, video and mouse ("KVM") selection via a control panel, an onboard service processor, and access to the floppy and CD-ROM drives in the media tray. A daughter card is connected via an onboard PCI-X interface and is used to provide additional high-speed links to switch modules 15.3 and 15.4 (described below). Each processor blade also has a front panel with 5 LED's to indicate current status, plus four push-button switches for power on/off, selection of processor blade, reset, and NMI for core dumps for local control.

Blades may be 'hot swapped' without affecting the operation of other blades in the system. A server blade is typically implemented as a single slot card (394.2 mm×226.99 mm); however, in some cases a single processor blade may require two slots. A processor blade can use any microprocessor technology as long as it compliant with the mechanical and electrical interfaces, and the power and cooling requirements of the server blade system.

For redundancy, processor blades have two signal and power connectors; one connected to the upper connector of the corresponding slot of midplane 20 (described below), and the other connected to the corresponding lower connector of the midplane. Processor Blades interface with other components in the server blade system via the following midplane interfaces: 1) Gigabit Ethernet (2 per blade; required); 2) Fibre Channel is (2 per blade; optional); 3) management module serial link; 4) VGA analog video link; 4) keyboard/mouse USB link; 5) CD-ROM and floppy disk drive ("FDD") USB link; 6) 12 VDC power; and 7) miscellaneous control signals. These interfaces provide the ability to communicate to other components in the server blade system such as management modules, switch modules, the CD-ROM and the FDD. These interfaces are duplicated on the midplane to provide redundancy. A processor blade typically supports booting from the media tray CDROM or FDD, the network (Fibre channel or Ethernet), or its local hard disk drive.

A media tray 22 includes a floppy disk drive and a CD-ROM drive that can be coupled to any one of the 14 blades. The media tray also houses an interface board on which is mounted interface LED's, a thermistor for measuring inlet air temperature, and a 4-port USB controller hub. System level interface controls consist of power, location, over temperature, information, and general fault LED's and a USB port.

Midplane circuit board 20 is positioned approximately in the middle of chassis 10 and includes two rows of connectors; the top row including connectors 25.1.1 (for first slot, first row) through 25.14.1 (fourteenth slot, first row), and the bottom row including connectors 25.1.2 through 25.14.2. Thus, each one of the 14 slots includes one pair of midplane connectors located one above the other (e.g., connectors 25.1.1 and 25.1.2) and each pair of midplane connectors mates to a pair of connectors at the rear edge of each processor blade (not visible in FIG. 1).

Figure 2:
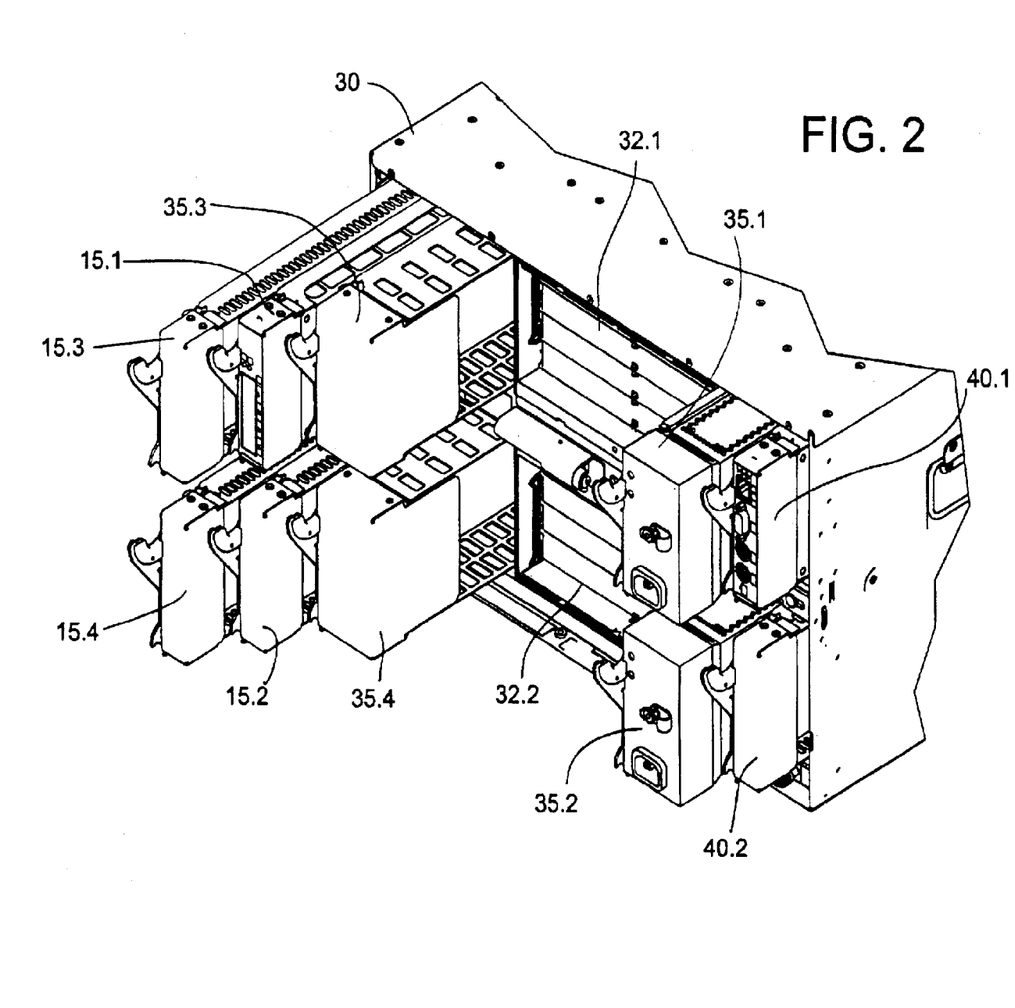
FIG. 2 is a rear, top and left side perspective view of the rear portion of the server blade system.

FIG. 2 is a rear, top and left side perspective view of the rear portion of the server blade system. Referring to FIGS. 1 and 2, a chassis 30 houses various hot plugable components for cooling, power, control and switching. Chassis 30 slides and latches into the rear of main chassis 10.

Two hot plugable blowers 32.1 and 32.2 include backward-curved impeller blowers and provide redundant cooling to the server blade system components. Airflow is from the front to the rear of chassis 10. Each of the processor blades 12.1 through 12.14 includes a front grille to admit air, and low-profile vapor chamber based heat sinks are used to cool the processors within the blades. Total airflow through the system chassis is about 300 CFM at 0.7 inches H2O static pressure drop. In the event of blower failure or removal, the speed of the remaining blower automatically increases to maintain the required airflow until the replacement unit is installed. Blower speed control is also controlled via a thermistor that constantly monitors inlet air temperature. The temperature of the server blade system components are also monitored and blower speed will increase automatically in response to rising temperature levels as reported by the various temperature sensors.

Four hot plugable power modules 35.1 through 35.4 provide DC operating voltages for the processor blades and other components. One pair of power modules provides power to all the management modules and switch modules, plus any blades that are plugged into slots 1–6. The other pair of power modules provides power to any blades in slots 7–14. Within each pair of power modules, one power module acts as a backup for the other in the event the first power module fails or is removed. Thus, a minimum of two active power modules are required to power a fully featured and configured chassis loaded with 14 processor blades, 4 switch modules, 2 blowers, and 2 management modules. However, tour power modules are needed to provide full redundancy and backup capability. The power modules are designed for operation between an AC input voltage range of 200VAC to 240VAC at 50/60 Hz and use an IEC320 C14 male appliance coupler. The power modules provide +12VDC output to the midplane from which all server blade system components get their power. Two +12VDC midplane power buses are used for redundancy and active current sharing of the output load between redundant power modules is performed.

Management modules 40.1 and 40.2 are hot-pluggable components that provide basic management functions such as controlling, monitoring, alerting, restarting and diagnostics. Management modules also provide other functions required to manage shared resources, such as the ability to switch the common keyboard, video, and mouse signals among processor blades.

Blade Expansion Unit According to the Present Invention

Figure 3:
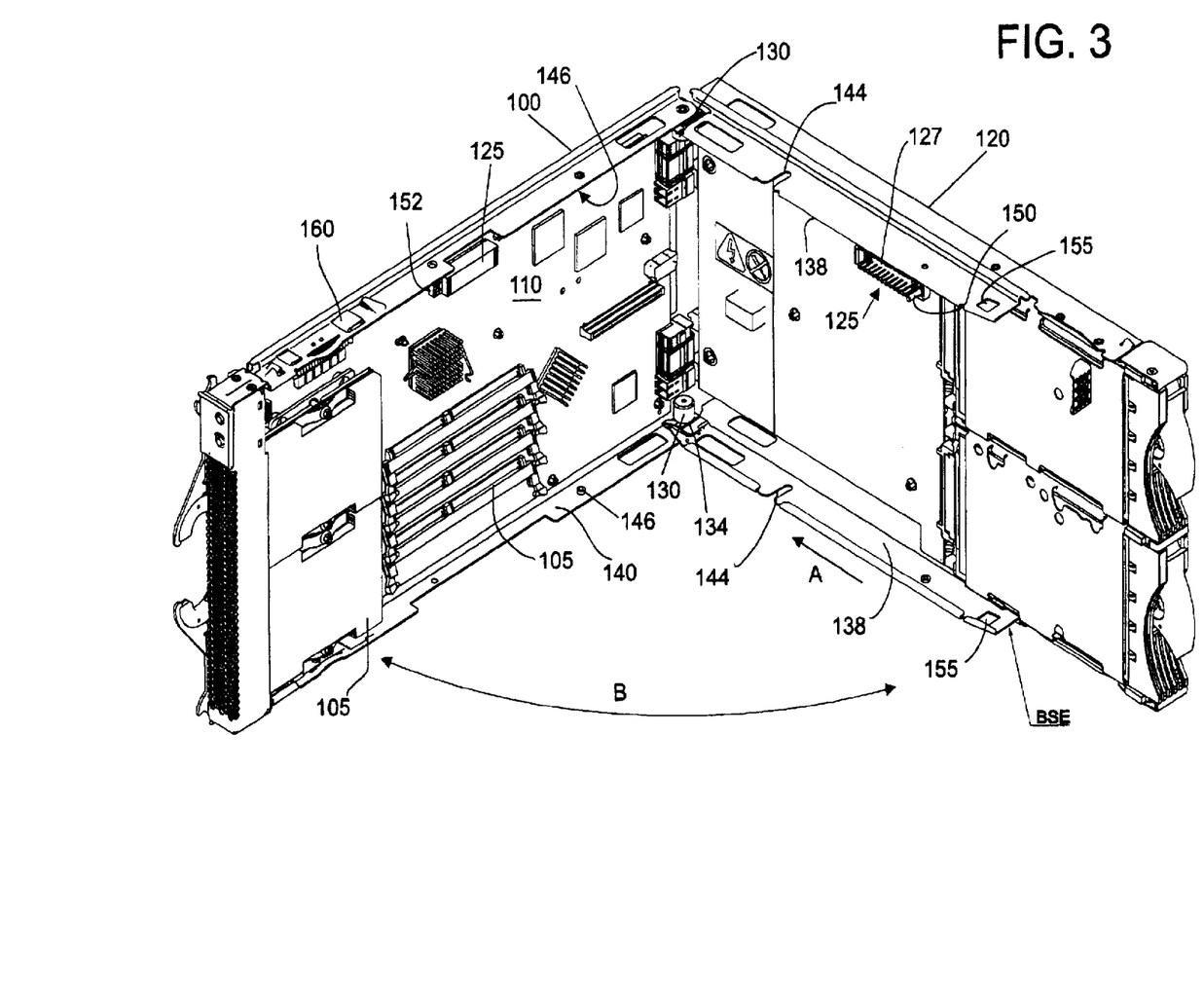
FIG. 3 is an exploded perspective view of a blade and an expansion unit according to one embodiment of the present invention.

Referring now to FIG. 3, a blade 100 is shown. Blade 100 includes a set of blade components 105 installed on the blade surface 110, the specific identity and function of the blade components being irrelevant for the present invention. Also shown is one embodiment of an expansion unit 120 according to the present invention. The expansion unit 120 also includes expansion components 122, the identity and function of which are not crucial to the present invention. The expansion components 122 may include one or more hard drives for providing additional storage capacity to the blade 100, specialized types of processors or adapters for expanding the functionality of the blade 100 or any other components desirable for improving the usefulness of the blade 100. These components may be readily identified by those skilled in the relevant arts.

Blade 100 includes a connector 125 adapted to mate with a connector 127 provided on the expansion unit 120. When the blade 100 is in use without an expansion unit 120, a terminating cover is installed on the connector 125. Connectors 125 and 127 may be male and female pin connectors of a standard pin configuration or any other type of compatible connectors which, when used in conjunction with the blade 100 and the expansion unit 120, allow the expansion components 122 to work with the blade components 105 to improve and expand the functionality of the blade 100.

Blade 100 includes pivot pins 130 adapted to receive the pivot clips 134 included on the expansion unit 120. The pivot pins 130 and pivot clips 134 are shown even more clearly in FIG. 4. As the expansion unit 120 is moved in the direction of the arrow A with the pivot clips 134 aligned with the pivot pins 130, the pivot clips 134 engage the pivot pins 130, forming a releasable pivoting connecting between the expansion unit 120 and the blade 100. The exact engagement and operation of the pivot dips 134 in cooperation with the pivot pins 130 are described in a related application. In accordance with the present invention, any means on the expansion unit 120 and the blade 100 to provide a releasable pivoting connection between the two will suffice.

Expansion unit 120 is provided with side walls 138 and blade 100 is provided with blade side walls 140. Side walls 138 are each provided with a radial slot 144. Blade side walls 140 are each provided with a protruding stud 146. The side walls 138, 140 and the slots 144 and studs 146 all cooperate to maintain alignment of the expansion unit 120 and the blade 100, as discussed below.

Expansion unit 120 is also provided with an alignment pin 150 while the blade 100 is provided with an alignment hole 152. Again, the pin 150 and the hole 152 cooperate to aid alignment of the blade 100 and the expansion unit 120. In the embodiment of the present invention depicted here, the alignment pin 150 and alignment hole 152 are located adjacent to the connectors 125, 127. This location is considered preferable in order to ensure proper alignment of the connectors but is not required. Persons of reasonable skill in the art will readily recognize that such alignment members may be located elsewhere and still provide suitable alignment aid.

Finally, the side walls 138 are each provided with a latch hole 155 which is designed to accept and cooperate with a latch tab 160 located on each of the blade side walls 140 as described below.

To install an expansion unit 120 according to the present invention, the expansion unit is moved in the direction of arrow A with the pivot clips 134 aligned with the pivot pins 130. Once the pivot clips 134 have engaged the pivot pins 130, the expansion unit 120 and the blade 100 are rotated toward one another as indicated by arrow B. As the two near one another, side walls 138 of the expansion unit 120 engage alongside the blade side walls 140, ensuring an initial side-to-side alignment of the two parts. As the rotation continues, the protruding studs 146 of the blade 100 engage with the radial slots 144 of the expansion unit 120, ensuring the front-to-back alignment of the two parts.

As the rotation continues and the expansion unit 120 nears contact with the surface 110 of the blade 100, the alignment pin 150 of the expansion unit 120 engages in the alignment hole 152 of the blade 100, ensuring that the alignment of the two parts is correct. In this manner, as the blade 100 and expansion unit 120 continue to rotate and come together, the connectors 125 and 127 mate together easily and securely.

Finally, in order to secure the connection, latch tabs 160 on each blade side wall 140 are spring loaded in an outward direction (away from the interior of the blade 100). As the expansion unit 120 is rotated against the blade 100, the latch tabs 160 are depressed as the side walls 138 of the expansion unit slide over them. When the expansion unit 120 is fully mated with the blade 100, the latch tabs 160 engage the latch holes 155 provided in the side walls 138 of the expansion unit 120, springing outward in response to their spring loading and securing the expansion unit 120 in connection with the blade 100. In order to reverse the process and un-install the expansion unit 120 from the blade 100, a user must simply depress the latch tabs 160 while rotating the expansion unit 120 in the opposite direction.

Figure 4:
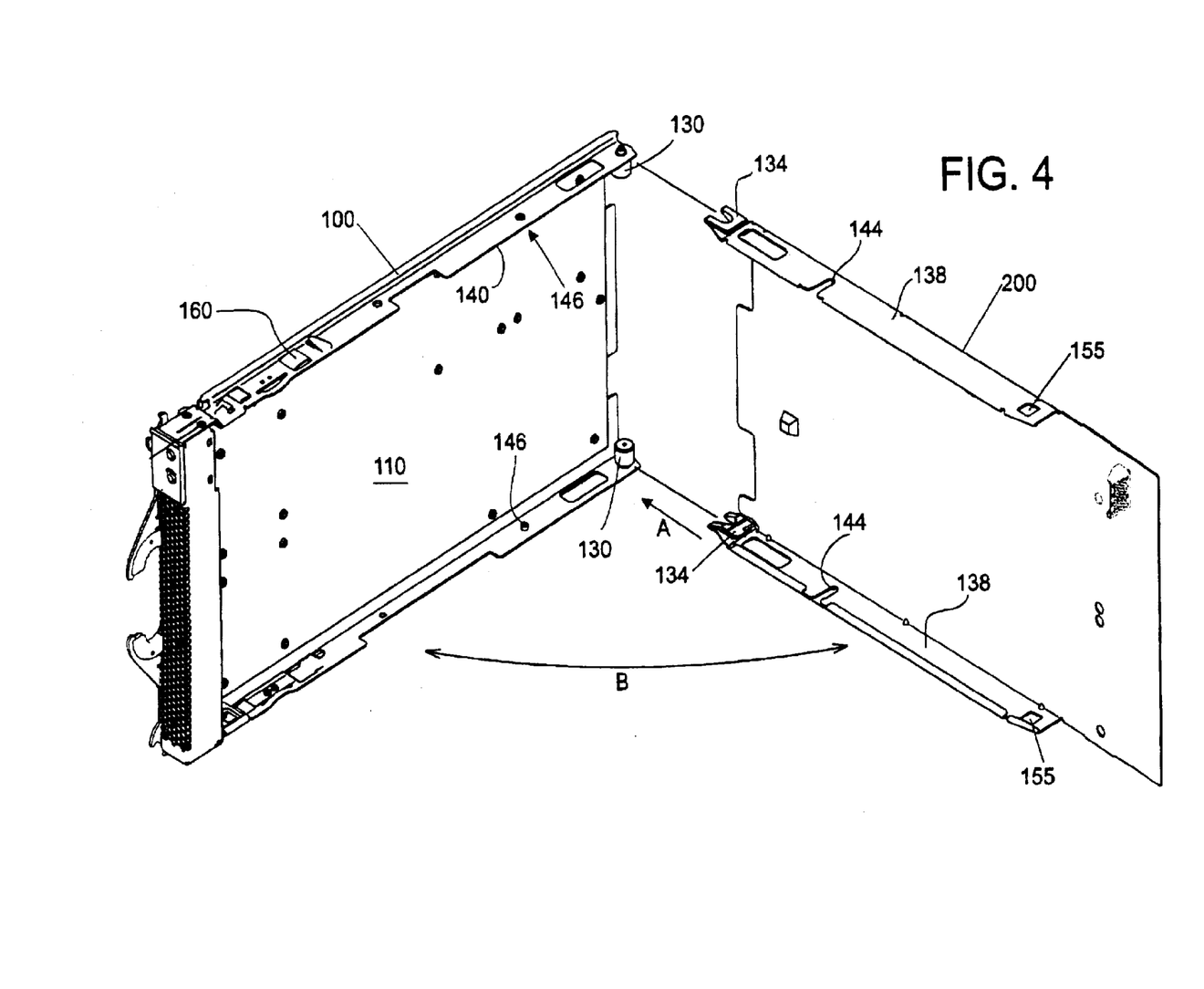
FIG. 4 is an exploded perspective view of a blade and a blade cover according to one embodiment of the present invention.

FIG. 4 illustrates a blade cover 200 in accordance with the present invention. The blade cover 200 is installed on the blade 100 whenever the blade is in use without an expansion unit 120. Blade cover 200 includes elements consistent with the connection elements of the expansion unit 120 so that the exchange of the blade cover 200 for the expansion unit 120, and vice versa, is very simple.

Blade cover 200 includes pivot clips 134, side walls 138, radial slots 144 and latch holes 155, all like the expansion unit 120. To install the blade cover 200 on the blade 100, one follows the same procedure described above for installation of the expansion unit.

FIG. 4 does not show any of the blade components 105 nor the connector 125. When the blade 100 is used with the blade cover 200, a terminating cover (not shown) is installed on the connector 125 (FIG. 3) prior to installation of the blade cover 200.

Figure 5:
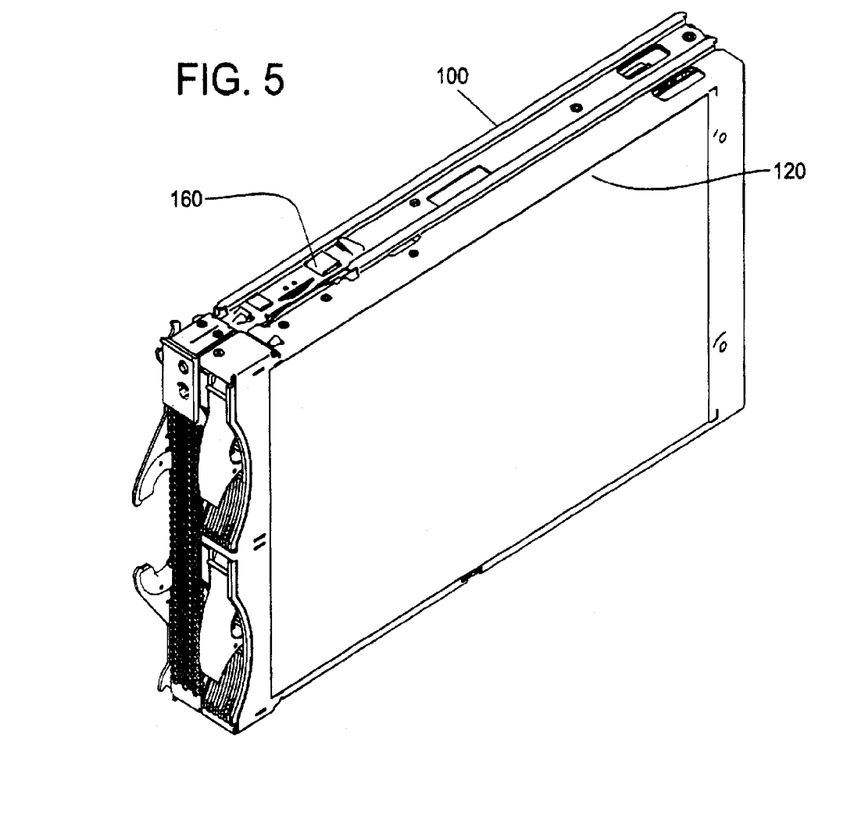
FIG. 5 is a perspective view of a blade with an expansion unit according to the present invention fully installed.

In FIG. 5 a blade 100 is shown fully mated with an expansion unit 120. The elements discussed above are enclosed within the structure and cannot be seen. Latch tab 160 can be seen protruding through latch hole 155 (not shown).

Figure 6:
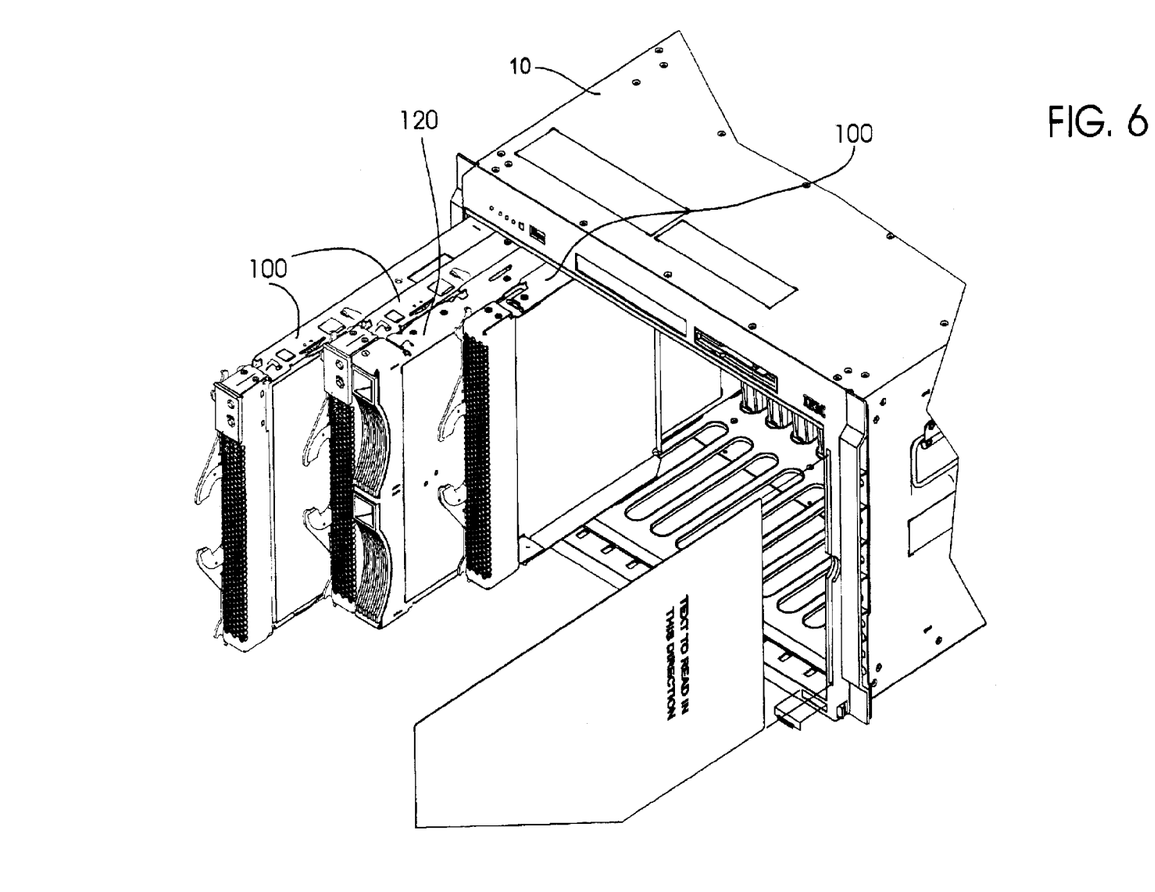
FIG. 6 is a front, top and right side exploded perspective view of a server blade chassis showing the insertion of blades according to the present invention.

FIG. 6 shows a main server blade system chassis 10 having several blades 100 inserted. The first and third blades 100 shown are standard, single-width blades. The second blade 100 is shown mated with an expansion unit 120 according to the present invention. As is apparent, the blade-expansion unit combination fits into the blade chassis 10 consistent with the standard blades, simply taking up two slots instead of one.

In the drawings and specification above there has been set forth a preferred embodiment of the present invention, and, although specific terms are used, the description thus given uses terminology in a generic and descriptive sense only and not for purposes of limitation.

What is claimed is:

1. An expansion unit for use with a blade, the expansion unit comprising:

a frame for holding expansion components;

at least two clips fixed to one end of the frame and each adapted to engage with one of at least two pins fixed to one end of the blade, forming a releasable pivoting connection between the blade and the expansion unit;

a first connector adapted to mate with a second connector located on the blade to form an operative connection between the blade components and the expansion components when the expansion unit and the blade are rotated about the clip-pin connection and brought together;

at least one alignment pin adapted to insert into at least one alignment hole on the blade, ensuring proper alignment of the first and second connectors when the blade and the expansion unit are brought together.

2. The expansion unit according to claim 1 wherein the frame further comprises:

at least two side walls adapted to engage alongside at least two blade side walls as the blade and the expansion unit are rotated about the clip-pin connection and brought together, ensuring proper side-to-side alignment of the blade and the expansion unit.

3. The expansion unit according to claim 2 wherein the at least two side walls each comprise:
   at least one slot adapted to engage at least one stud projecting inward from each blade side wall as the blade and the expansion unit are rotated about the clip-pin connection and brought together, ensuring proper front-to-back alignment of the blade and expansion unit.

4. The expansion unit according to claim 3 wherein the at least two side walls each further comprises:
   at least one latch hole adapted to receive at least one latch tab formed in each blade side wall when the blade and the expansion unit are rotated about the clip-pin connection and brought completely together, releasably securing the blade and expansion unit together.

5. The expansion unit according to claim 4 wherein each at least one latch tab is biased from the plane of the blade side wall in an outward direction.

6. A blade expansion system comprising:
   a blade comprising:
      a blade frame for holding blade components;
      at least two pivot pins fixed to one end of the frame;
      a first connector;
      a first alignment member; and
   an expansion unit comprising;
      an expansion frame for holding expansion components;
      at least two pivot clips fixed to one end of the expansion frame and each
   adapted to engage with one of the at least two pivot pins, forming a releasable pivoting connection between the blade and the expansion unit;
      a second connector adapted to mate with the first connector to form an operative connection between the blade components and the expansion components when the expansion unit and the blade are rotated about the clip-pin connection and brought together;
      a second alignment member adapted to cooperate with the first alignment member to ensure proper alignment of the first and second connectors when the blade and the expansion unit are brought together.

7. The blade expansion system of claim 6 wherein the first alignment member comprises an alignment hole and the second alignment member comprises an alignment pin.

8. The blade expansion system of claim 6 wherein:
   the blade frame further comprising:
      at least two blade side walls; and
   the expansion frame further comprising:
      at least two side walls adapted to engage alongside the at least two blade side walls as the blade and the expansion unit are rotated about the clip-pin connection and brought together, ensuring proper side-to-side alignment of the blade and the expansion unit.

9. The blade expansion system of claim 8 wherein:
   the blade side walls each further comprising:
      at least one stud projecting inward; and
   the side walls each further comprising:
      at least one slot adapted to engage the at least one stud as the blade and the expansion unit are rotated about the clip-pin connection and brought together, ensuring proper front-to-back alignment of the blade and expansion unit.

10. The blade expansion system of claim 9 wherein:
   the blade side walls each further comprising:
      at least one latch tab biased from the plane of the blade side wall in an outward direction; and
   the side walls each further comprising:
      at least one latch hole adapted to receive the least one biased latch tab when the blade and the expansion unit are rotated about the clip-pin connection and brought completely together, releasably securing the blade and expansion unit together.

* * * * *